United States Patent
Hsu

(10) Patent No.: US 11,063,212 B2
(45) Date of Patent: Jul. 13, 2021

(54) MAGNETIC TUNNEL JUNCTION DEVICE AND FORMATION METHOD THEREOF

(71) Applicant: TAIWAN SEMICONDUCTOR MANUFACTURING CO., LTD., Hsinchu (TW)

(72) Inventor: Chern-Yow Hsu, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/569,545

(22) Filed: Sep. 12, 2019

(65) Prior Publication Data

US 2021/0083178 A1    Mar. 18, 2021

(51) Int. Cl.
*H01L 43/12* (2006.01)
*H01L 27/22* (2006.01)
*G11C 11/16* (2006.01)
*H01L 43/10* (2006.01)
*H01L 43/08* (2006.01)

(52) U.S. Cl.
CPC ............ *H01L 43/12* (2013.01); *G11C 11/161* (2013.01); *H01L 27/222* (2013.01); *H01L 43/08* (2013.01); *H01L 43/10* (2013.01)

(58) Field of Classification Search
CPC ......... H01L 43/10; H01L 43/12; H01L 43/08; H01L 27/222; G11C 11/161
See application file for complete search history.

(56) References Cited

U.S. PATENT DOCUMENTS

| 10,002,905 B2* | 6/2018 | Park .................. H01L 27/222 |
| 2015/0021726 A1* | 1/2015 | Min ...................... H01L 43/08 257/421 |
| 2020/0106008 A1* | 4/2020 | Peng .................. H01L 27/222 |

* cited by examiner

*Primary Examiner* — Kyoung Lee
*Assistant Examiner* — Christina A Sylvia
(74) *Attorney, Agent, or Firm* — Maschoff Brennan

(57) ABSTRACT

A method of forming a magnetic tunnel junction (MTJ) device includes forming MTJ layers over a dielectric layer; performing a first etching operation on the MTJ layers to form MTJ stacks, in which the first etching operation is performed such that a metal-containing doped region is formed in the dielectric layer and between the MTJ stacks; and performing a second etching operation to break through the metal-containing doped region.

20 Claims, 11 Drawing Sheets

100

US 11,063,212 B2

MAGNETIC TUNNEL JUNCTION DEVICE AND FORMATION METHOD THEREOF

BACKGROUND

In integrated circuit (IC) devices, magnetroresistive random access memory (MRAM) is an emerging technology for next generation embedded memory devices. MRAM is a non-volatile memory where data is stored in magnetic storage elements. In simple configurations, each cell has two ferromagnetic plates, each of which can hold a magnetic field, separated by a thin insulating layer. MRAM has a simple cell structure and complementary metal oxide semiconductor (CMOS) logic comparable processes which result in a reduction of the manufacturing complexity and cost in comparison with other non-volatile memory structures.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
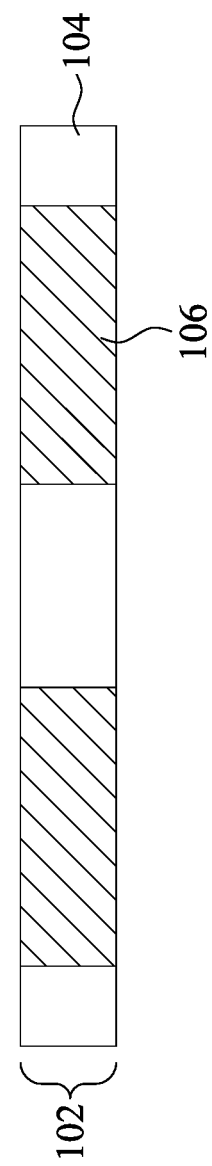
FIGS. 1-10 are cross-sectional views of the MRAM device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The MTJ stack includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the MTJ stack is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the MTJ stack is in a lower resistive state, corresponding to a digital signal "0". When the magnetic moment of the ferromagnetic free layer is anti-parallel to that of the ferromagnetic pinned layer, the resistance of the MTJ stack is in a higher resistive state, corresponding to a digital signal "1". The MTJ stack is coupled between top and bottom electrode and an electric current flowing through the MTJ stack (tunneling through the tunnel barrier layer) from one electrode to the other is detected to determine the resistance and the digital signal state of the MTJ stack.

According to some embodiments of this disclosure, the MRAM device is formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes, for example, silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 is a cross-sectional view of the MRAM device 100 at an intermediate stage of manufacture according to various embodiments of the present disclosure. Reference is made to FIG. 1. In some embodiments, an interconnect structure 102 having an inter-layer dielectric (ILD) layer or inter-metal dielectric layer (IMD) layer 104 with a metallization pattern 106 is formed over a substrate (not shown in FIG. 1). The ILD layer 104 may be silicon oxide, fluorinated silica glass (FSG), carbon doped silicon oxide, tetra-ethyl-ortho-silicate (TEOS) formed oxide, phosphosilicate glass (PSG), boro-phosphosilicate glass (BPSG), Black Diamond® (Applied Materials of Santa Clara, Calif.), amorphous fluorinated carbon, low-k dielectric material, the like or combinations thereof. The metallization patterns 106 may be aluminum, aluminum alloy, copper, copper alloy, titanium, titanium nitride, tantalum, tantalum nitride, tungsten, the like, and/or combinations thereof. Formation of the metallization patterns 106 and the ILD layer 104 may be a dual-damascene process and/or a single-damascene process.

Figure 2:
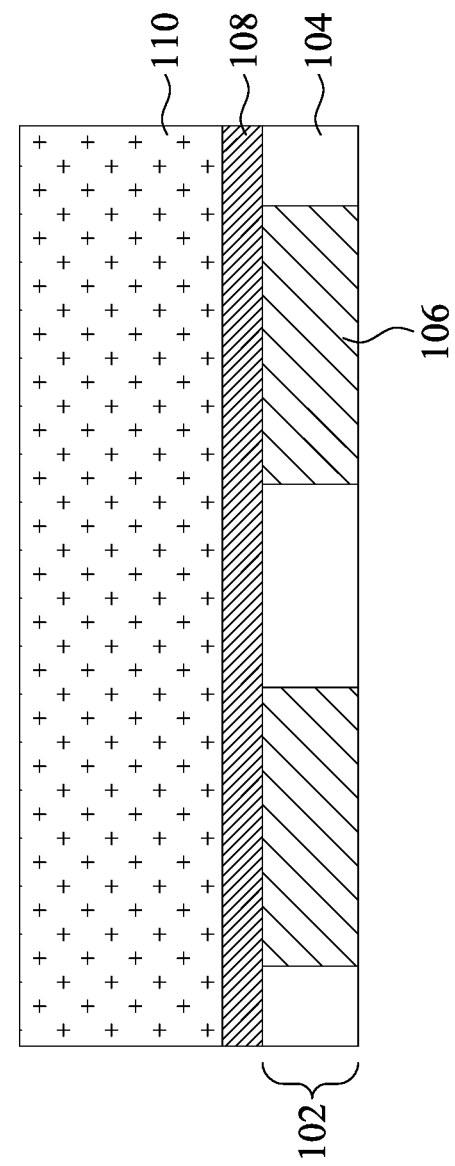

FIG. 2 is a cross-sectional view of the MRAM device 100 at an intermediate stage of manufacture according to various embodiments of the present disclosure. Reference is then made to FIG. 2. An etch stop layer 108 may be blanket formed over the interconnect structure 102. The etch stop layer 108 controls the end point of a subsequent etch process. In various embodiments, the etch stop layer 108 may be formed by a vapor deposition technique (e.g., physical vapor deposition, chemical vapor deposition, etc.) and include a silicon nitride (SiN) layer, a silicon carbide (SiC) layer, a silicon oxycarbide (SiOC) layer, and/or some other suitable etch stop layers. A dielectric layer 110 is formed over the etch stop layer 108. The dielectric layer 110 may be formed by acceptable deposition techniques, such as chemical vapor deposition (CVD), atomic layer deposition (ALD), physical vapor deposition (PVD), the like, and/or a combination thereof. A chemical-mechanical polish (CMP) process is optionally performed to the dielectric layer 110, until a desirable thickness is achieved. The dielectric layer 110 can be, for example, silicon dioxide layer, silicon carbide layer, silicon nitride layer, silicon oxycarbide layer, silicon oxynitride layer, low-k dielectric (e.g., having a dielectric constant of less than about 3.9) layer, extreme low-k (ELK) dielectric (e.g., having a dielectric constant of less than about 2.5) layer, the like, or combinations thereof.

Figure 3:
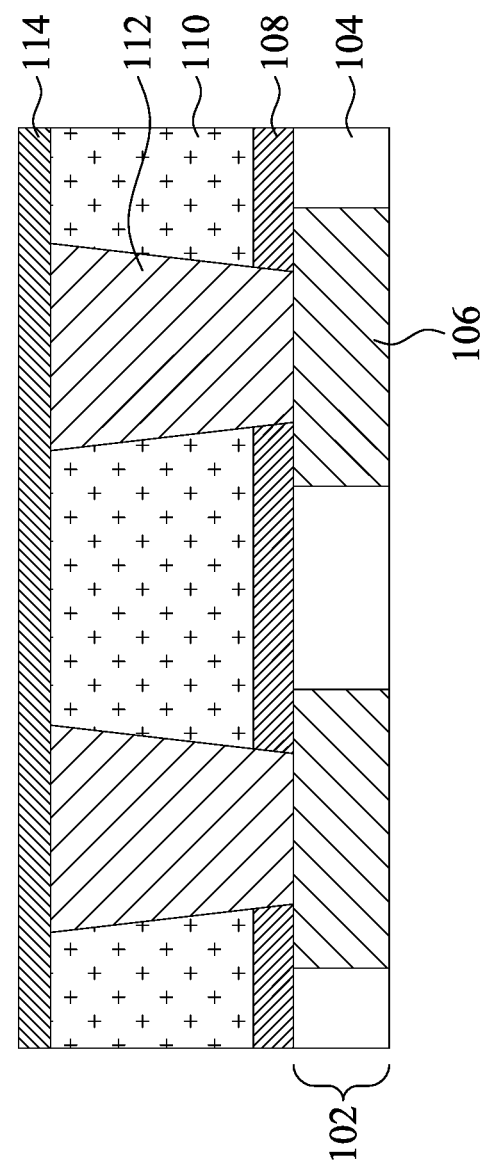
Figure 11:
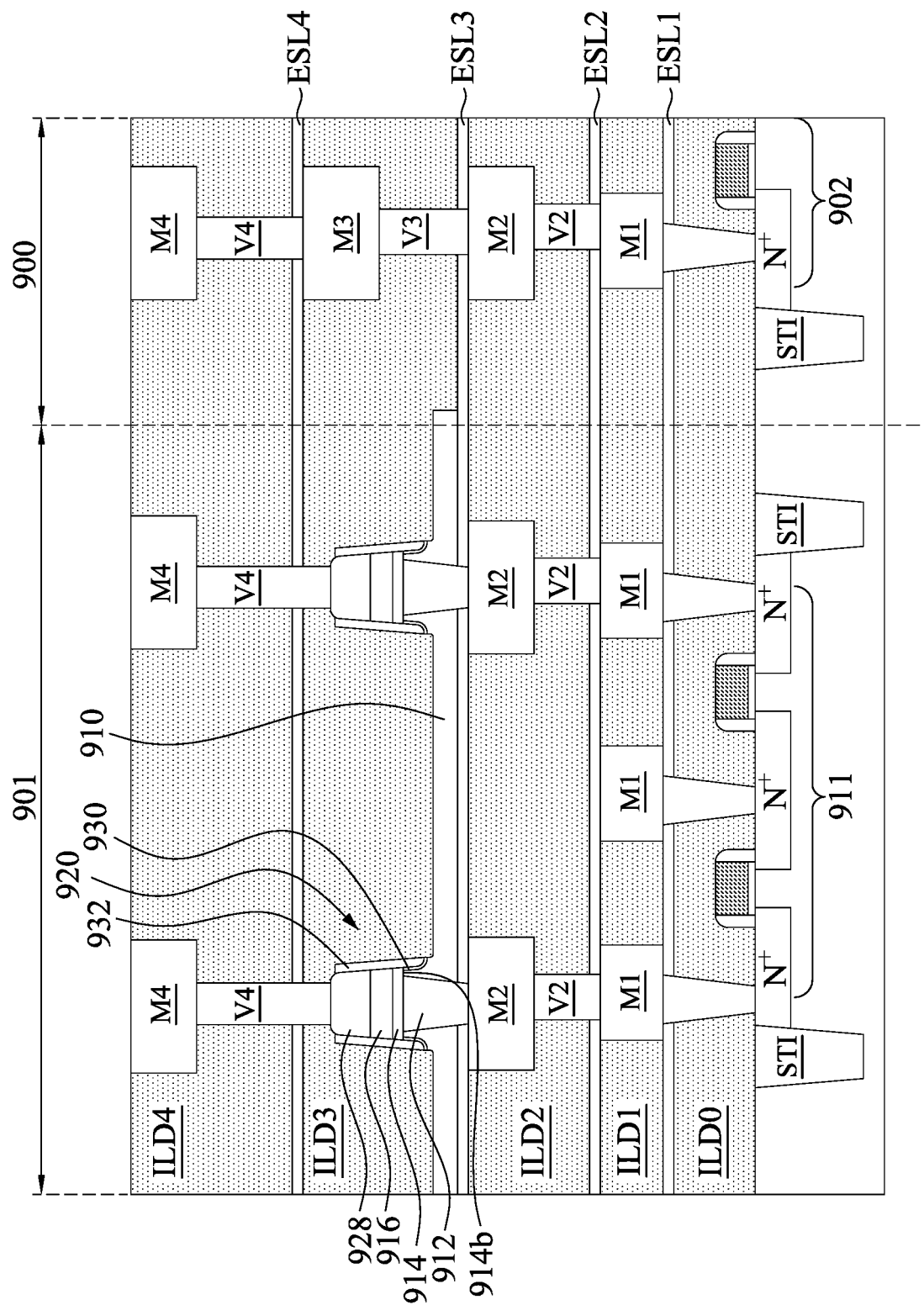
FIG. 11 illustrates an integrated circuit including MRAM devices and logic devices.

FIG. 3 is a cross-sectional view of the MRAM device 100 at an intermediate stage of manufacture according to various embodiments of the present disclosure. As shown in FIG. 3, bottom electrode vias (BEVA) 112 are then formed within the dielectric layer 110 and the etch stop layer 108. An exemplary formation method of the BEVAs 112 includes etching an opening in the dielectric layer 110 and etching an opening in the etch stop layer 108, filling metal into the openings, and performing a planarization process, such as a CMP process, to remove excess materials of the filling metal outside the opening in the dielectric layer 110. The remaining filling metal in the opening in the dielectric layer 110 can serve as the BEVAs 112. In some embodiments, the BEVAs 112 are electrically connected to an underlying electrical component, such as a transistor (e.g., transistor as shown in FIG. 11), through the metallization patterns 106. In some embodiments, the filling metal is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

A bottom electrode layer 114 is then blank formed over the BEVAs 112 and over the dielectric layer 110, so that the bottom electrode layer 114 extends along top surfaces of the BEVAs 112 and of the dielectric layer 110. The bottom electrode layer 114 can be a single-layered structure or a multi-layered structure. The bottom electrode layer 114 includes a material the same as the filling metal of the BEVAs 112 in some embodiments. In some other embodiments, the bottom electrode layer 114 includes a material different from the filling metal of the BEVAs 112. In some embodiments, bottom electrode layer 114 is titanium (Ti), tantalum (Ta), tantalum nitride (TaN), titanium nitride (TiN), tungsten (W), ruthenium (Ru), molybdenum (Mo), cobalt (Co), the like, and/or combinations thereof. Formation of the bottom electrode layer 114 may be exemplarily performed using CVD, PVD, ALD, the like, and/or a combination thereof. The bottom electrode layer 114 may have a thickness in a range from 10 nm to about 100 nm in some embodiments.

Figure 4:
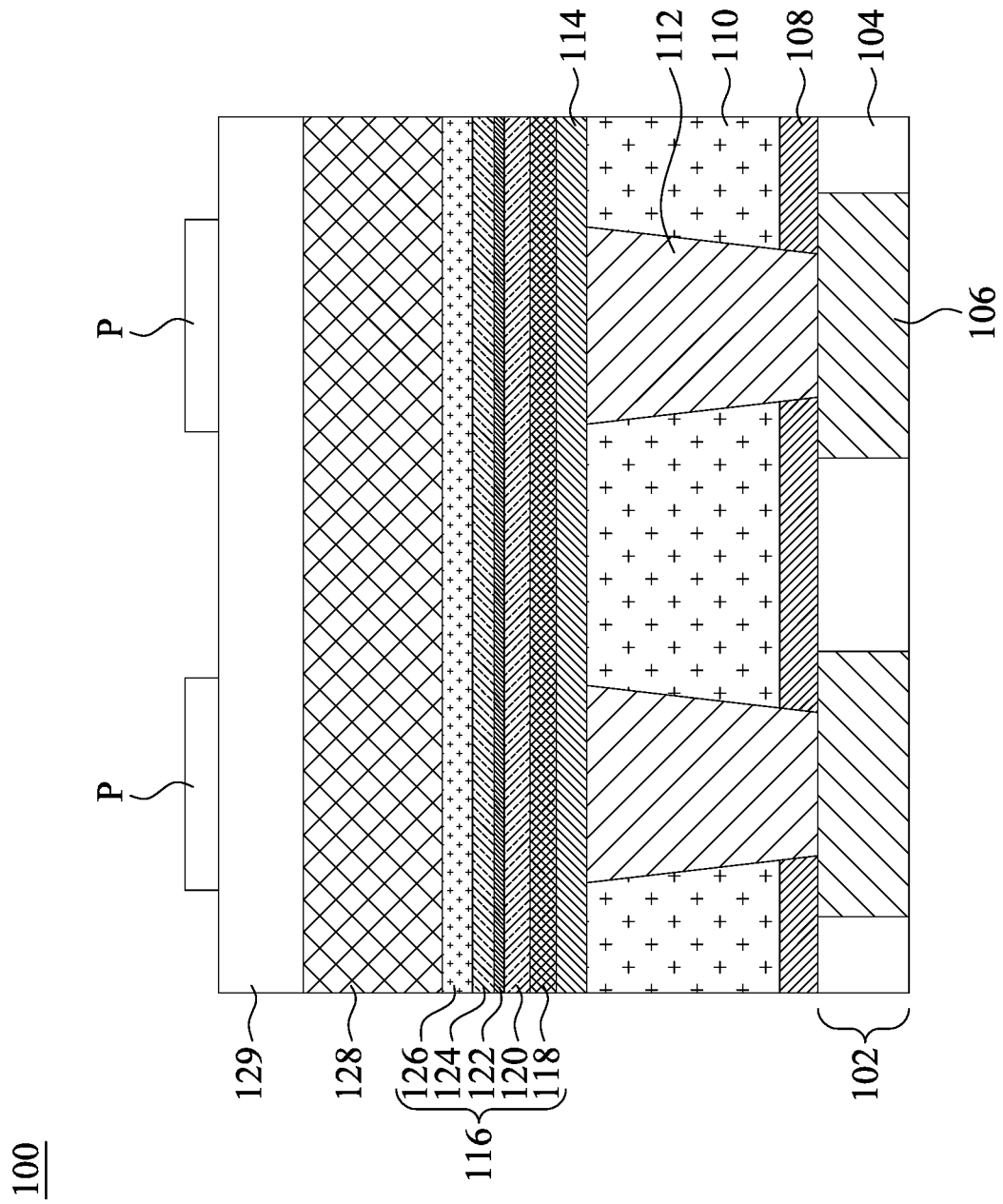

FIG. 4 is a cross-sectional view of the MRAM device 100 at an intermediate stage of manufacture according to various embodiments of the present disclosure. Reference is made to FIG. 4. Magnetic tunnel junction (MTJ) layers are formed over the bottom electrode layer 114. The MTJ layers 116 include a seed layer 118, a ferromagnetic pinned layer 120, a tunneling layer 122, a ferromagnetic free layer 124, and a capping layer 126 formed in sequence over the bottom electrode layer 114. The seed layer 118 includes Ta, TaN, Cr, Ti, TiN, Pt, Mg, Mo, Co, Ni, Mn, or alloys thereof, and serves to promote a smooth and uniform grain structure in overlying layers. The seed layer 118 may have a thickness in a range from 5 nm to about 10 nm in some embodiments. The ferromagnetic pinned layer 120 may be formed of an anti ferromagnetic (AFM) layer and a pinned ferroelectric layer over the AFM layer. The AFM layer is used to pin or fix the magnetic direction of the overlying pinned ferroelectric layer. The ferromagnetic pinned layer 120 may be formed of, for example, ferroelectric metal or alloy (e.g., Co, Fe, Ni, B, Mo, Mg, Ru, Mn, Ir, Pt, or alloys thereof) having a thickness in a range from about 3 nm to about 7 nm.

The tunneling layer 122 is formed over the ferromagnetic pinned layer 120. The tunneling layer 122 is thin enough that electrons are able to tunnel through the tunneling layer 122 when a biasing voltage is applied on a resulting MTJ stack 116' fabricated from the MTJ layers 116. In some embodiments, the tunneling layer 122 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$), or combinations thereof. The tunneling layer 122 has a thickness in a range from about 0.5 nm to about 2 nm in some embodiments. Exemplary formation methods of the tunneling layer 122 include sputtering, PVD, ALD, or the like.

Still referring to FIG. 4, the ferromagnetic free layer 124 is formed over the tunneling layer 122. A direction of a magnetic moment of the ferromagnetic free layer 124 is not pinned because there is no anti-ferromagnetic material adjacent the ferromagnetic free layer 124. Therefore, the magnetic orientation of this layer 124 is adjustable, thus the layer 124 is referred to as a free layer. In some embodiments, the direction of the magnetic moment of the ferromagnetic free layer 124 is free to rotate parallel or anti-parallel to the pinned direction of the magnetic moment of the ferromagnetic pinned layer 120. The ferromagnetic free layer 124 may include a ferromagnetic material similar to the material in the ferromagnetic pinned layer 120. In some embodiments, the ferromagnetic free layer 124 includes Co, Fe, B, Mo, or combinations thereof. The ferromagnetic free layer 124 has a thickness in a range from about 1 nm to about 3 nm in some embodiments. Exemplary formation methods of the ferromagnetic free layer 124 include sputtering, PVD, ALD, or the like.

The capping layer 126 is deposited over the ferromagnetic free layer 124. The capping layer 126 includes Ta, Co, B, Ru, Mo, MgO, AlO, or combinations thereof. The material of the capping layer 126 is chosen such that it has an adequate etching resistance in a subsequent etching which will be described details later. A thickness of the capping layer 126 is chosen such that it provides an adequate protection for the ferromagnetic free layer 124 in the subsequent etching and meets a target of tunneling magnetoresistance (TMR) of the MRAM device 100. As an example, a thickness of the capping layer 126 is in a range from about 1 nm to about 4 nm. The capping layer 126 may be deposited by PVD or alternatively other suitable processes.

A top electrode layer 128 is formed on the capping layer 126. In some embodiments, the top electrode layer 128 is similar to the bottom electrode layer 114 in terms of composition. In some embodiments, the top electrode layer 128 includes Ti, Ta, Ru, W, TaN, TiN, the like or combinations thereof. An exemplary formation method of the top electrode layer 128 includes sputtering, PVD, ALD or the like. The top electrode layer 128 may have a thickness in a range from 10 nm to about 100 nm in some embodiments.

A hard mask layer 129 is formed over the top electrode layer 128. In some embodiments, the hard mask layer 129 may be silicon carbide (SiC), silicon oxynitride (SiON), silicon nitride (SiN), silicon dioxide ($SiO_2$), the like, and/or combinations thereof. The hard mask layer 129 may be formed by acceptable deposition techniques, such as CVD, ALD, PVD, the like, and/or combinations thereof.

In some embodiments, a patterned resist mask P is formed over the hard mask layer 129. A resist layer is formed over the hard mask layer 129 and then patterned into a patterned resist mask P using a suitable photolithography process, such that portions of the hard mask layer 129 are exposed by the patterned resist mask P. In some embodiments, the patterned resist mask P is a photoresist. In some embodiments, the patterned resist mask P is an ashing removable dielectric (ARD), which is a photoresist-like material generally having generally the properties of a photoresist and amendable to etching and patterning like a photoresist. An exemplary photolithography process may include photoresist coating (e.g., spin-on coating), soft baking, mask aligning, exposure, post-exposure baking, developing the photoresist, rinsing, drying (e.g., hard baking), other suitable processes, or combinations thereof.

Figure 5:
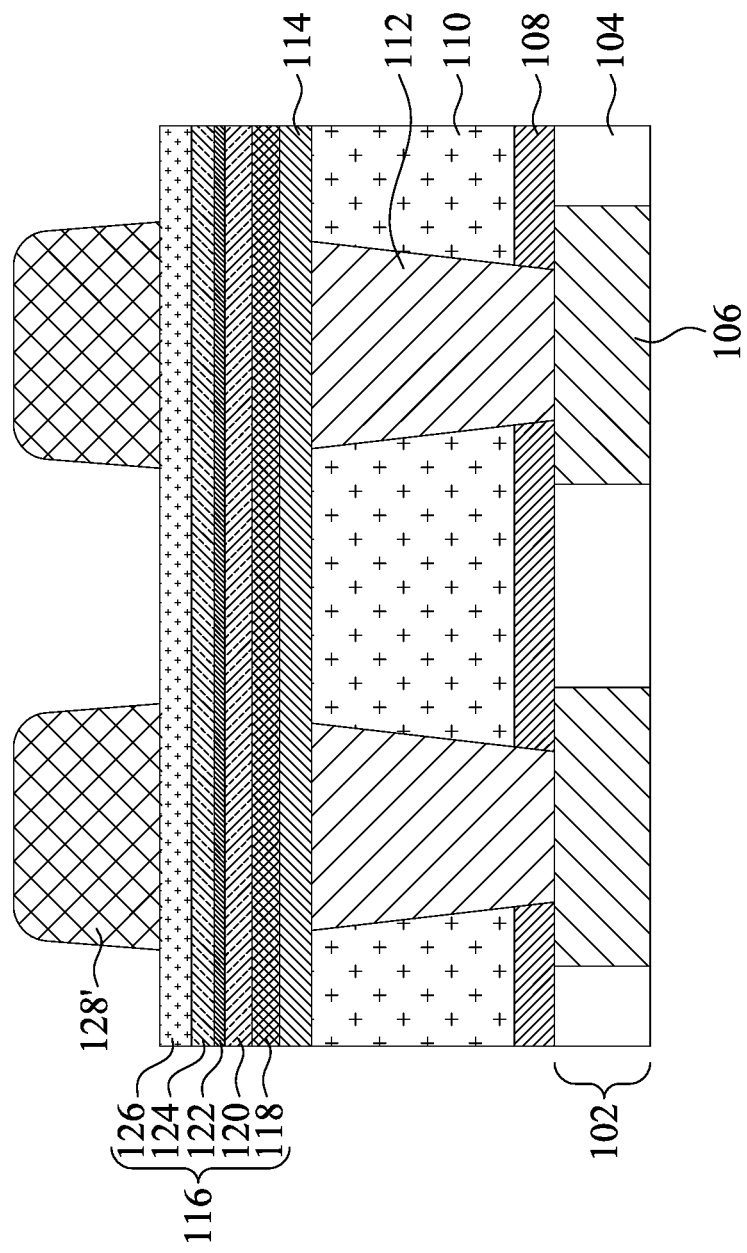

FIG. 5 is a cross-sectional view of the MRAM device 100 at an intermediate stage of manufacture according to various embodiments of the present disclosure. As shown in FIG. 5, the hard mask layer 129 and the underlying top electrode layer 128 are then etched, and hence forming top electrodes 128'. The patterned resist mask P and the hard mask layer 129 are then removed using suitable processes such as ashing and/or etching. Top electrodes 128' are used as etch masks for patterning the underlying layers.

Figure 6:
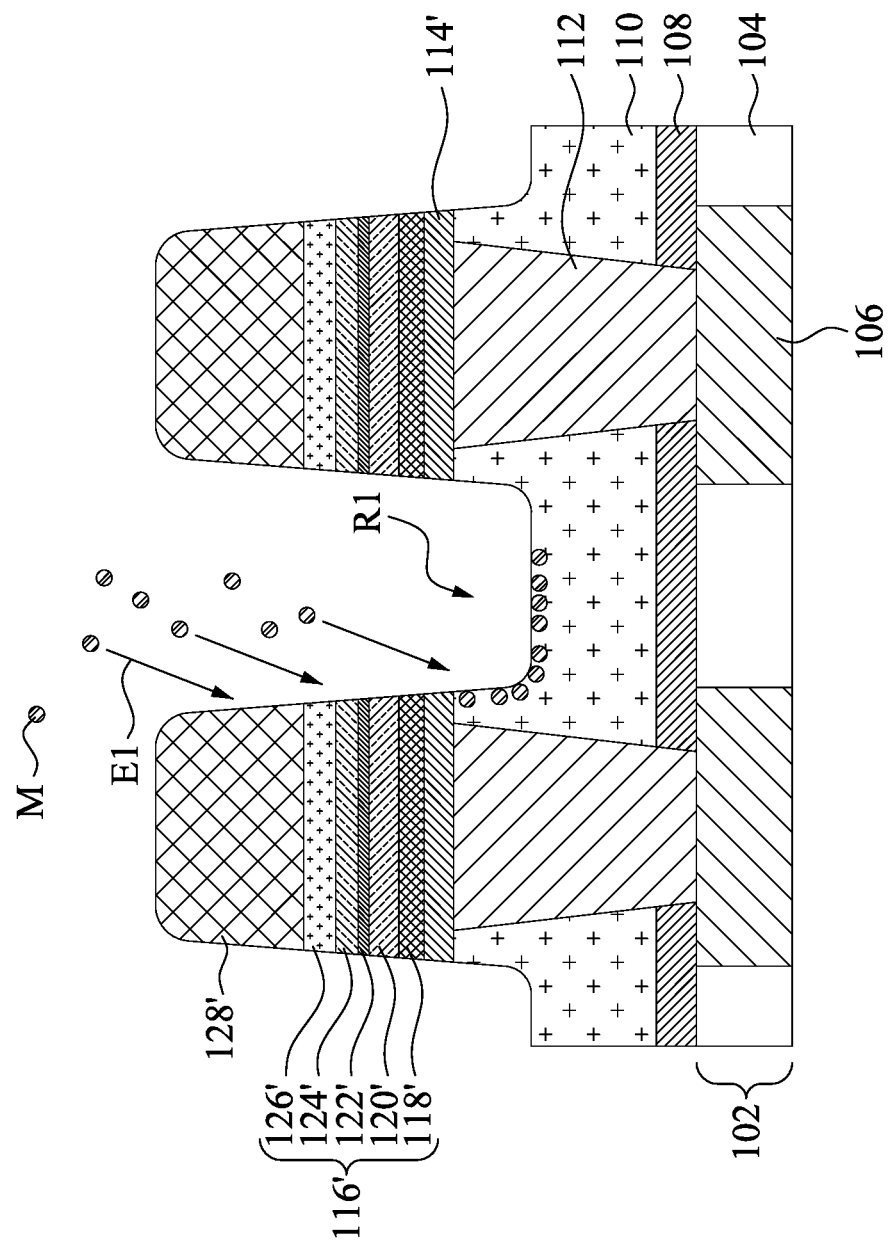
Figure 7:
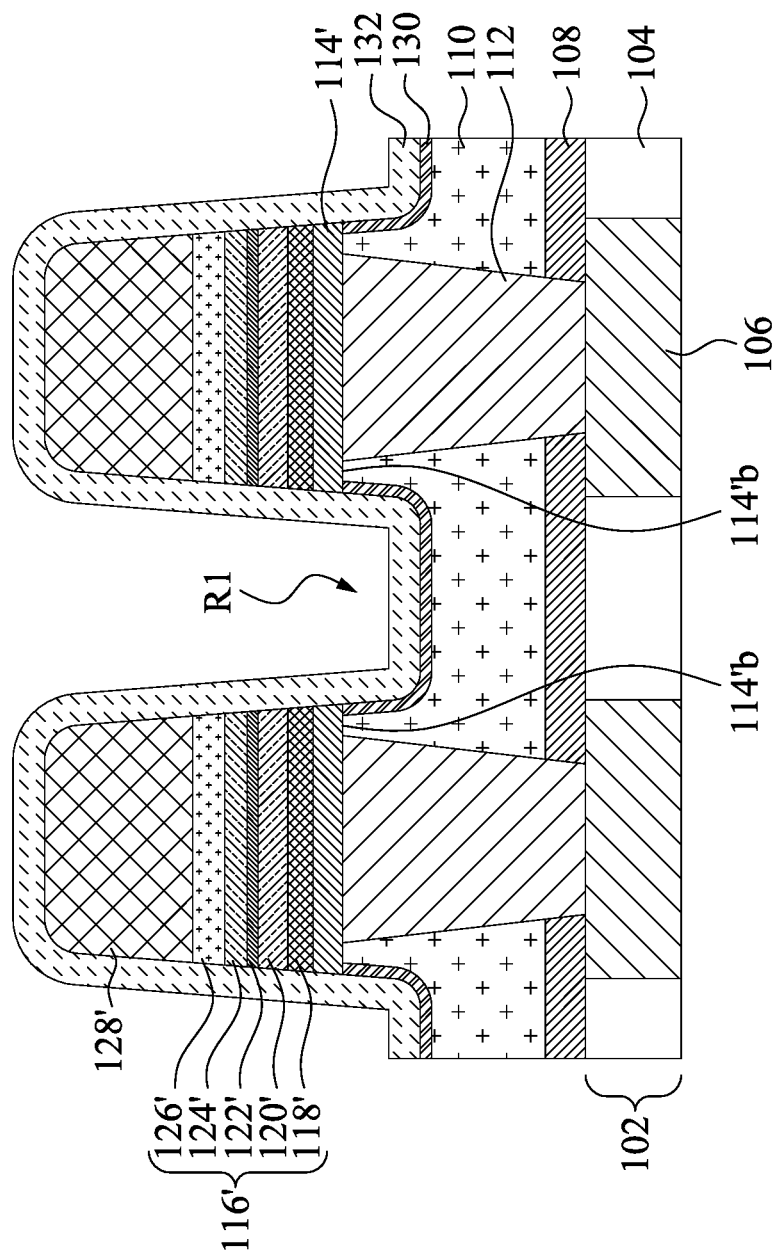

FIG. 6 is a cross-sectional view of the MRAM device 100 at an intermediate stage of manufacture according to various embodiments of the present disclosure. As shown in FIG. 6, an etching process E1 is performed to pattern the MTJ layers 116 using the top electrodes 128' as etch masks. In greater detail, the etching process E1 removes portions of the MTJ layers 116, the bottom electrode layer 114, and the underlying dielectric layer 110 not protected by the top electrodes 128'. The etching process E1 further etches the dielectric layer 110, thus resulting in a recess R1 in the dielectric layer 110. After the etching process E1, remaining capping layers 126', remaining ferromagnetic free layers 124', remaining tunneling layers 122', remaining ferromagnetic pinned layers 120', and remaining seed layers 118' are in combination referred to as MTJ stacks 116'. The bottom electrode layer 114 is patterned as bottom electrodes 114' under the respective MTJ stacks 116'. Opposite sidewalls and a top surface of the dielectric layer 110 are exposed to the recess R1. The etching process E1 may be an anisotropic etching process. For example, the etching process E1 is a dry etching process including an ion beam etch (IBE) process as illustrated in FIG. 6. In embodiments where the etching process E1 is an IBE process, the MTJ layers 116, the bottom electrode layer 114, and the underlying dielectric layer 110 are exposed to a bombardment of ions. Removed materials M (e.g., etching by-products which include metal ions) of the MTJ layers 116 and the bottom electrode layer 114 are dislodged from their exposed surfaces and may be driven into the dielectric layer 110. During the IBE process, the removed materials M (e.g., etching by-products which include metal ions) have enough energy to penetrate through the dielectric layer 110. A top portion and opposite side portions of the dielectric layer 110 are thus doped with such removed metal materials M, thus leading to an increased conductivity in doped regions of the dielectric layer 110. These doped top portion and doped side portions are thus collectively referred to as a conductive doped region 130, as shown in FIG. 7. That is to say, the conductive doped region 130 includes etching by-products resulting from the etching process E1. In this way, the conductive doped region 130 has metal materials of the MTJ layers 116 and/or the bottom electrode layer 114. The conductive doped region 130 is formed to line the recess R1.

In particular, the conductive doped region 130 has a U-shaped cross section profile and extends to reach bottom surfaces 114'b of the bottom electrodes 114' of two neighboring MTJ stacks 116'. As a result, the conductive doped region 130 constitutes one leakage path between two neighboring MTJ stacks 116', thereby causing electrical shorts therebetween. Because the MTJ layers 116 include metals, the conductive doped region 130 can be referred to as a metal-containing doped region as well.

A spacer layer 132 is formed over a top surface of the conductive doped region 130, along a sidewall of the conductive doped region 130, along a sidewall of the bottom electrode, along a sidewall of the MTJ stack 116', along a sidewall of the top electrode, and over a top surface of the top electrode. The spacer layer 132 encapsulates the conductive doped region 130, the bottom electrodes 114', the MTJ stacks 116', and the top electrodes 128'. In some embodiments, the spacer layer 132 includes SiN, the like, or combinations thereof. The spacer layer 132 may be formed using CVD, ALD, or PVD the like, and/or combinations thereof. The spacer layer 132 is thin enough such that a width of the recess R1 is still wide enough, which in turn improves a gap fill window of a subsequently formed IMD layer (e.g, an ILD layer 134 in FIG. 10).

Figure 8:
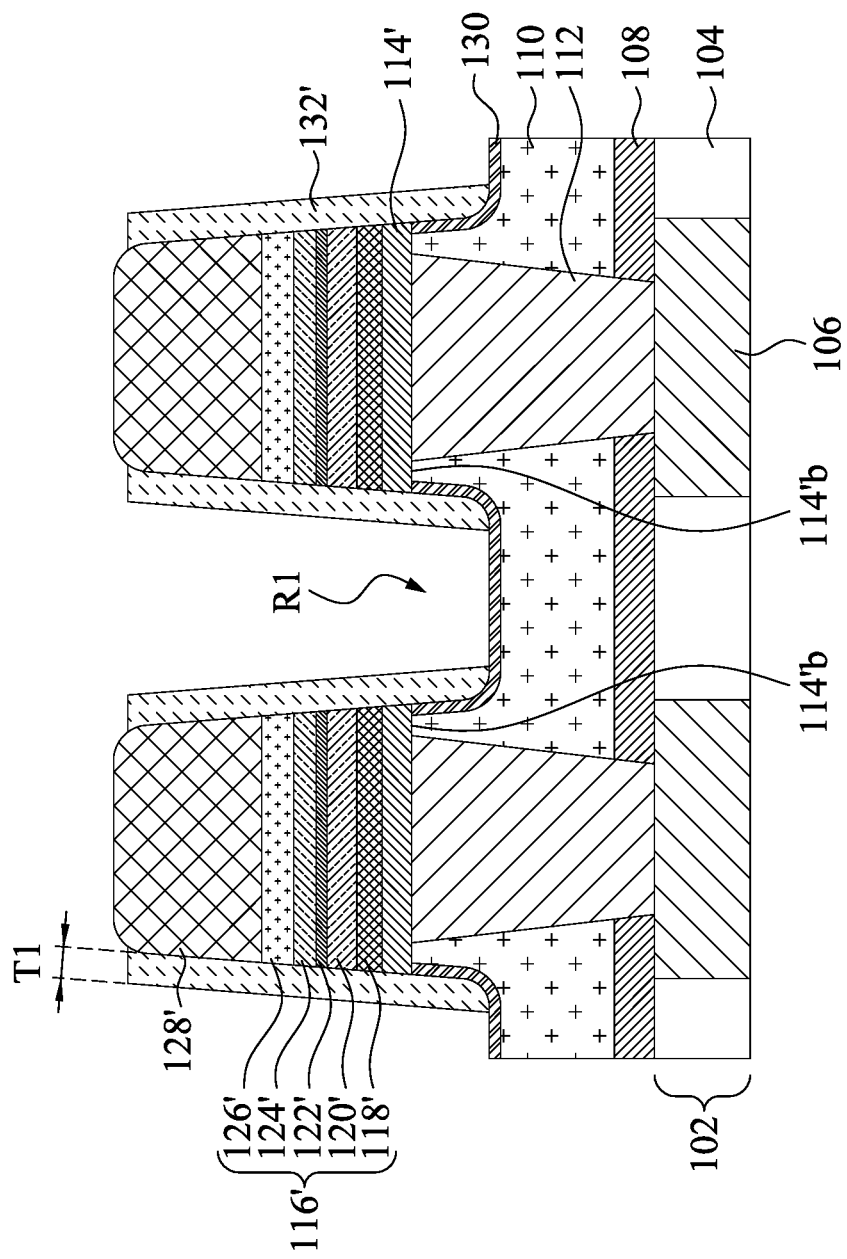

FIG. 8 is a cross-sectional view of the MRAM device 100 at an intermediate stage of manufacture according to various embodiments of the present disclosure. Reference is made to FIG. 8. An etching process is performed to etch the spacer layer 132 into at least one spacer 132'. The etching process may be an anisotropic etch process. After the etching process, the top surface of the conductive doped region 130 is partially exposed. The spacer 132' remains on and is in contact with the sidewalls of the top electrodes 128', of the MTJ stacks 116', and of the bottom electrodes 114'. The spacer 132' remains on and is in contact with the sidewall, a portion of the top surface, and a corner between the sidewall and the portion of the top surface of the conductive doped region 130 as well. The spacer 132' laterally surrounds the bottom electrode 114', the MTJ stack 116', and the top electrode 128'. In some embodiments, the spacer 132' has a thickness T1 in a range from about 1 nm to about 30 nm.

Figure 9:
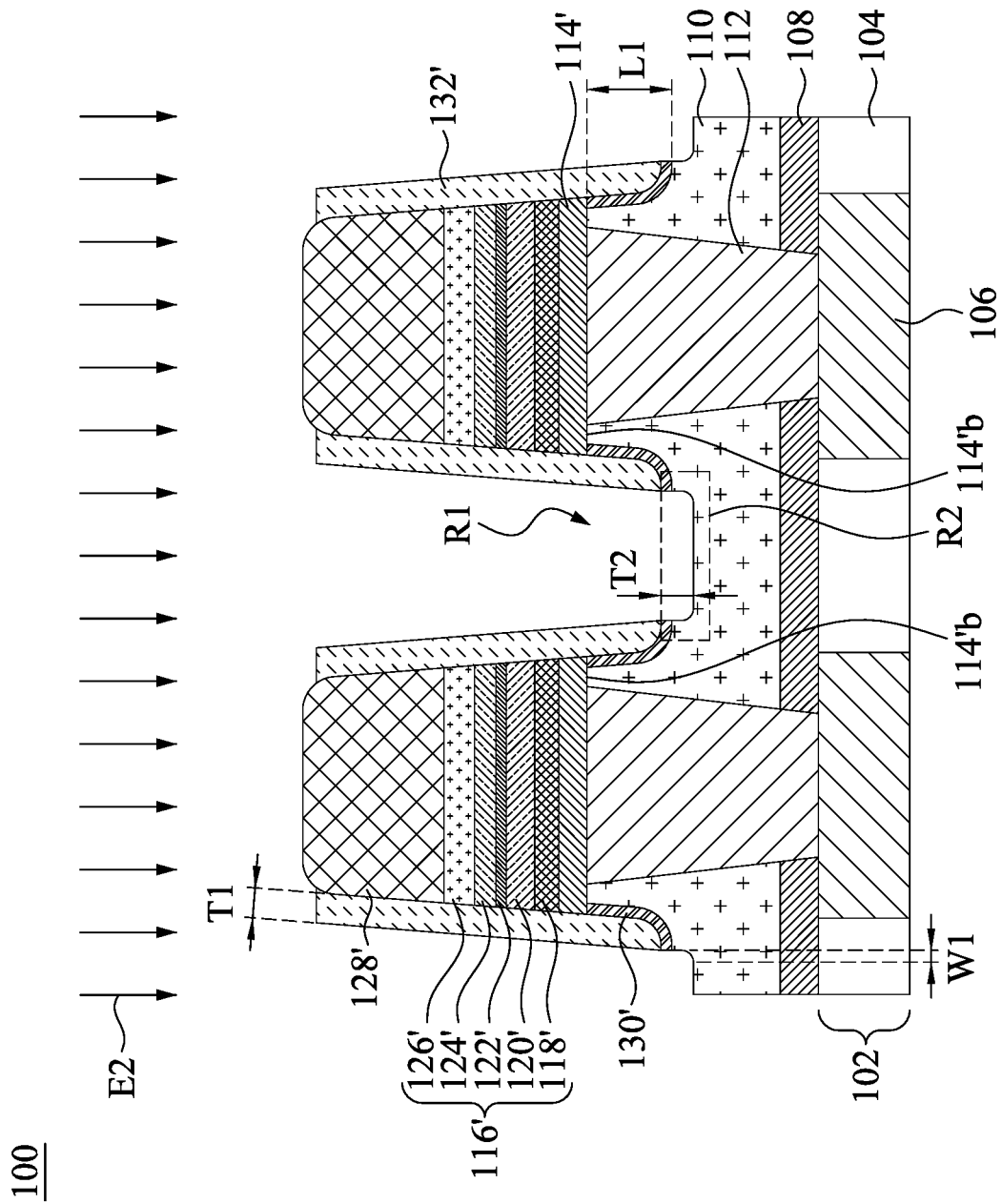

FIG. 9 is a cross-sectional view of the MRAM device 100 at an intermediate stage of manufacture according to various embodiments of the present disclosure. Reference is made to FIG. 9. An etching process E2 is performed to deepen the recess R1 to break through the conductive doped region 130. That is, an exposed region of the conductive doped region 130 not covered by the spacer 132' is etched. In particular, the etching process E2 is performed to etch the conductive doped region 130 and the underlying dielectric layer 110 to form a recess extension R2 under the recess R1 to extend a vertical depth T2 and a horizontal width W1. A bottommost position of the spacer 132' is higher than a bottommost position of the recess extension R2 in a top surface of the dielectric layer 110. A bottommost position of the conductive doped region 130' is higher than a bottommost position of the recess extension R2 in a top surface of the dielectric layer 110. In some embodiments, the recess extension R2 may be etched until the recess extension R2 has the vertical depth T2 from an exposed top surface of the dielectric layer 110 and horizontally extends a width W1 from the recess R1 to the sidewall of the dielectric layer 110. In some embodiments, the vertical depth T2 of the recess extension R2 is in a range from about 2 nm to about 5 nm. In some embodiments, the width W1 of the recess extension R2 is in a range from about 1 nm to about 3 nm. The etching process may be a wet chemical etch or a dry chemical etch.

The conductive doped region 130 has a horizontal portion and side portions connected to opposite sides of the horizontal portion. The horizontal portion of the conductive doped region 130 is thus removed and at least one side portion of the conductive doped region 130 remains. The remaining side portion of the conductive doped region 130 can be referred to as a conductive doped region 130', as shown in FIG. 9. The conductive doped region 130' is in a side portion of the dielectric layer 110 between the spacer 132' and the BEVA 112. The conductive doped region 130' forms a curved interface, for example, a concave interface with the spacer 132'. An interface between the dielectric layer 110 and the bottom electrode 114' is coterminous with an interface between the conductive doped region 130' and the bottom electrode 114'. The etching process E2 can thereby prevent electrical shorts between the two neighboring MTJ stacks 116'. After the etching process E2, a portion of the top surface and a portion of the sidewall of the dielectric layer 110 and a sidewall of the conductive doped region 130' are exposed. The conductive doped region 130' has a vertical length L1 extending from an interface between a top surface of the conductive doped region 130' and the bottom surface 114'b of the bottom electrode to an interface between a bottom surface of the conductive film and the dielectric layer 110. In some embodiments, the length L1 is in a range from about 10 nm to about 200 nm. The conductive doped region 130' and the underlying dielectric layer 110 are etched self-aligned using the MTJ stack 116' and the spacers 132' as a self-aligned mask without using a lithography patterning process. Therefore, the etching process is referred to as a self-aligned etching process. The fabrication cost is reduced.

Figure 10:
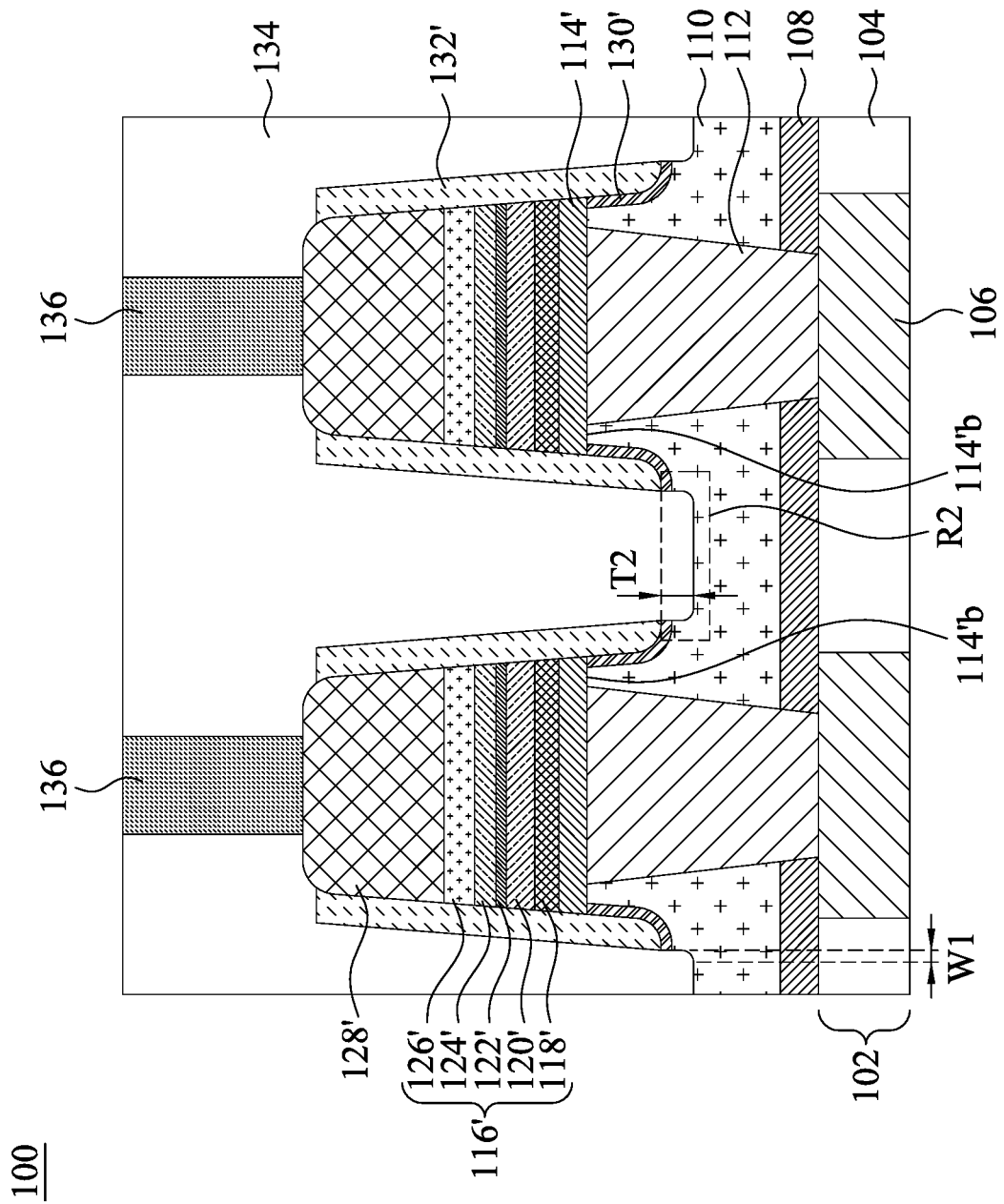

FIG. 10 is a cross-sectional view of the MRAM device 100 at various intermediate stages of manufacture according to various embodiments of the present disclosure. Reference is made to FIG. 10. Another ILD layer 134 is formed over the interconnect structure 102, and upper metallization patterns 136 are then formed in the ILD layer 134. Formation of the upper metallization patterns 136 may be formed by etching an opening in the ILD layer 134, and then filling one or more metals in the opening to form the upper metallization patterns 136, so that the upper metallization patterns 136 can reach on the top electrode. In some embodiments, the opening and the metallization pattern may be formed by a dual-damascene process. Trenches and via openings are formed through the ILD layer 134, and then filled with a conductive material (e.g., copper). A planarization is then performed.

In some embodiments, the ILD layer 134 may have the same material as the ILD layer 104. In some other embodiments, the ILD layer 134 may have a different material than the ILD layer 104. In some embodiments, the ILD layer 134 includes silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

FIG. 11 illustrates an integrated circuit including MRAM devices and logic devices. The integrated circuit includes a logic region 900 and a MRAM region 901. Logic region may 900 include circuitry, such as the exemplary transistor, for processing information received from MRAM devices 920 in the MRAM region 901 and for controlling reading and writing functions of MRAM devices 920. In some embodiments, the MRAM device 920 includes an MTJ stack 916, a top electrode 928 over the MTJ stack 916, a bottom electrode 914 under the MTJ stack 916, and a BEVA 912 under the bottom electrode 914 and in the dielectric layer 910 and an etch stop layer ESL3. The MRAM device 920 includes conductive films 930 in contact with sidewalls of the dielectric layer 910 and in contact with a bottom surface 914b of the bottom electrode 914. The conductive films 930 are separated from each other, such that an unwanted electrical connection between the bottom electrodes 914 of the two neighboring MTJ stacks 916 can be prevented. The MRAM device 920 further includes spacers 932 extending along the conductive film 930, the bottom electrode 914, the MTJ stack 916, and the top electrode 928.

As depicted, the integrated circuit is fabricated using five metallization layers, labeled as M1 through M4, with five layers of metallization vias or interconnects, labeled as V2 through V4. Other embodiments may contain more or fewer metallization layers and a corresponding more or fewer number of vias. Logic region 900 includes a full metallization stack, including a portion of each of metallization layers M1-M4 connected by interconnects V2-V4, with M1 connecting the stack to a source/drain contact of logic transistor 902. The MRAM region 901 includes a full metallization stack connecting MRAM devices 920 to transistors 911 in the MRAM region 901, and a partial metallization stack connecting a source line to transistors 911 in the MRAM region 901. MRAM devices 920 are depicted as being fabricated in between the top of the M2 layer and the bottom the M4 layer. Also included in integrated circuit is a plurality of ILD layers. Five ILD layers, identified as ILD0 through ILD4 are depicted in FIG. 11 as spanning the logic region 900 and the MRAM region 901. The ILD layers may provide electrical insulation as well as structural support for the various features of the integrated circuit during many fabrication process steps. The ILD layers between two metallization layers may include etch stop layers, identified as ESL1-ESL4 therebetween to signaling the termination point of an etching process and protect any underlying layer or layers during the etching process.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that unwanted leakage path caused by the etching by-products, which may be driven into the dielectric layer between two neighboring MTJ stacks, is avoided by an additional recessing process. Another advantage is that such recessing process can be performed using the MTJ stack and the spacer as a self-aligned mask without the need for extra masks.

In some embodiments, a method of forming a magnetic tunnel junction (MTJ) device includes forming MTJ layers over a dielectric layer; performing a first etching operation on the MTJ layers to form MTJ stacks, in which the first etching operation is performed such that a metal-containing doped region is formed in the dielectric layer and between the MTJ stacks; and performing a second etching operation to break through the metal-containing doped region.

In some embodiments, a method of forming a magnetic tunnel junction (MTJ) device includes forming a bottom electrode layer over a dielectric layer; forming MTJ layers over the bottom electrode layer; forming a top electrode over the MTJ layers; patterning the MTJ layers and the bottom electrode layer to form an MTJ stack and a bottom electrode under the MTJ stack; forming a spacer that laterally surrounds the bottom electrode, the MTJ stack, and the top electrode; and after forming the spacer, etching an exposed region of the dielectric layer that is not covered by the spacer.

In some embodiments, a magnetic tunnel junction (MTJ) device includes a bottom electrode via, a MTJ stack, a spacer, and a metal-containing doped region. The bottom electrode via extends through a dielectric layer. The MTJ stack is over the bottom electrode and includes a ferromagnetic pinned layer, a tunneling layer, and a ferromagnetic free layer. The tunneling layer is over the ferromagnetic pinned layer. The ferromagnetic free layer is over the tunneling layer. The spacer laterally surrounds the MTJ stack. The metal-containing doped region is in the dielectric layer and under the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a magnetic tunnel junction (MTJ) device, the method comprising:
    forming MTJ layers over a dielectric layer;
    performing a first etching operation on the MTJ layers to form MTJ stacks, wherein the first etching operation is performed such that a metal-containing doped region is formed in the dielectric layer and between the MTJ stacks; and
    performing a second etching operation to break through the metal-containing doped region.

2. The method of claim 1, wherein the metal-containing doped region comprises an etching by-product resulting from the first etching operation.

3. The method of claim 1, wherein the metal-containing doped region comprises a material of the MTJ layers.

4. The method of claim 1, wherein the first etching operation is performed such that a recess is formed in the dielectric layer, and the metal-containing doped region is formed to line the recess.

5. The method of claim 4, wherein the second etching operation is performed such that the recess is deepened.

6. The method of claim 1, further comprising:
    encapsulating the MTJ stacks with a spacer layer after performing the first etching operation.

7. The method of claim 6, further comprising:
    prior to performing the second etching operation, performing an anisotropic etching process on the spacer layer until the metal-containing doped region is exposed.

8. The method of claim 7, wherein a portion of the metal-containing doped region remains under the spacer layer after performing the second etching operation.

9. The method of claim 8, wherein the second etching operation is performed such that a bottommost position of the spacer layer is higher than a bottommost position of a recess in a top surface of the dielectric layer.

10. The method of claim 1, wherein the second etching operation is performed such that a bottommost position of the metal-containing doped region is higher than a bottommost position of a recess in a top surface of the dielectric layer.

11. A method of forming a magnetic tunnel junction (MTJ) device, the method comprising:
    forming a bottom electrode layer over a dielectric layer;
    forming MTJ layers over the bottom electrode layer;
    forming a top electrode over the MTJ layers;
    patterning the MTJ layers and the bottom electrode layer to form an MTJ stack and a bottom electrode under the MTJ stack;
    forming a spacer that laterally surrounds the bottom electrode, the MTJ stack, and the top electrode; and
    after forming the spacer, etching an exposed region of the dielectric layer that is not covered by the spacer.

12. The method of claim 11, wherein patterning the MTJ layers and the bottom electrode layer is performed such that a conductive region is formed in the dielectric layer.

13. The method of claim 12, wherein the conductive region has a U-shaped cross section profile.

14. The method of claim 12, wherein etching the exposed region of the dielectric layer breaks through the conductive region in the dielectric layer.

15. The method of claim 11, wherein patterning the MTJ layers and the bottom electrode layer is performed such that metal ions are driven into the dielectric layer.

16. The method of claim 15, wherein the metal ions are dislodged from the bottom electrode layer, the MTJ layers, the top electrode, or combinations thereof.

17. The method of claim 11, wherein etching the exposed region of the dielectric layer is performed using the top electrode and the spacer as an etch mask.

18. A magnetic tunnel junction (MTJ) device, comprising:
    a bottom electrode via extending through a dielectric layer;
    a MTJ stack over the bottom electrode, comprising:
        a ferromagnetic pinned layer;
        a tunneling layer over the ferromagnetic pinned layer; and
        a ferromagnetic free layer over the tunneling layer;
    a spacer laterally surrounding the MTJ stack; and
    a metal-containing doped region in the dielectric layer and under the spacer.

19. The MTJ device of claim 18, wherein the metal-containing doped region forms a curved interface with the spacer.

20. The MTJ device of claim 18, wherein an interface between the dielectric layer and the bottom electrode is coterminous with an interface between the metal-containing doped region and the bottom electrode.

* * * * *